United States Patent
Wang et al.

(10) Patent No.: US 8,780,652 B2
(45) Date of Patent: Jul. 15, 2014

(54) SIGNAL TRACKING IN WRITE OPERATIONS OF MEMORY CELLS

(75) Inventors: Bing Wang, Palo Alto, CA (US); Kuoyuan (Peter) Hsu, San Jose, CA (US); Young Suk Kim, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 44 days.

(21) Appl. No.: 13/418,968

(22) Filed: Mar. 13, 2012

(65) Prior Publication Data

US 2013/0242678 A1    Sep. 19, 2013

(51) Int. Cl.
*G11C 7/00* (2006.01)
*G11C 7/22* (2006.01)

(52) U.S. Cl.
CPC .................................. *G11C 7/22* (2013.01)
USPC ... 365/191; 365/194; 365/189.05; 365/233.1; 365/233.11; 365/233.12

(58) Field of Classification Search
CPC .......... G11C 7/222; G11C 7/12; G11C 7/227; G11C 8/08
USPC ............ 365/191, 194, 189.05, 233.1, 233.11, 365/233.12
See application file for complete search history.

(56) References Cited

U.S. PATENT DOCUMENTS

2013/0215693 A1*   8/2013   Tao et al. .................... 365/194

* cited by examiner

*Primary Examiner* — Thong Q Le
(74) *Attorney, Agent, or Firm* — Lowe Hauptman & Ham, LLP (57) ABSTRACT

In a method, a first edge of a first tracking signal in a first direction of a memory array is generated. A first edge of a second tracking signal in a second direction of the memory array is generated. A first edge of a write-timing control signal is generated based on a slower edge of the first edge the first tracking signal and of the first edge of the second tracking signal. The first edge of the write-timing control signal is used to generate a second edge of the second tracking signal.

21 Claims, 10 Drawing Sheets

Fig. 5

SIGNAL TRACKING IN WRITE OPERATIONS OF MEMORY CELLS

FIELD

The present disclosure is related to tracking signals in writing operations of memory cells.

BACKGROUND

Write tracking circuits for memory cells provide signals based on which write signals for a memory cell having data written therein are generated. Generally, the write tracking circuits are designed such that the worst case condition for writing to the memory cell is covered.

In one existing method for tracking write signals of a memory cell, a signal path for a tracking write bit line is similar to a signal path for a write bit line of the memory cell. When the tracking write bit line is pulled down to about half of the operational voltage of the memory cell, a signal to reset the write signals for the memory cell is activated. In various conditions, the tracking timing does not cover the worst case timing for the memory cell.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. The write-signal tracking scheme in various embodiments tracks the write timing of a static random access memory (SRAM) cell in an SRAM macro. The tracking timing automatically varies with different configurations of the SRAM macro, and is therefore useful for different configurations. The tracking scheme covers the worst case write timing in both the write bit line and the write word line directions of the memory macro.

Memory Macro

Figure 1A:
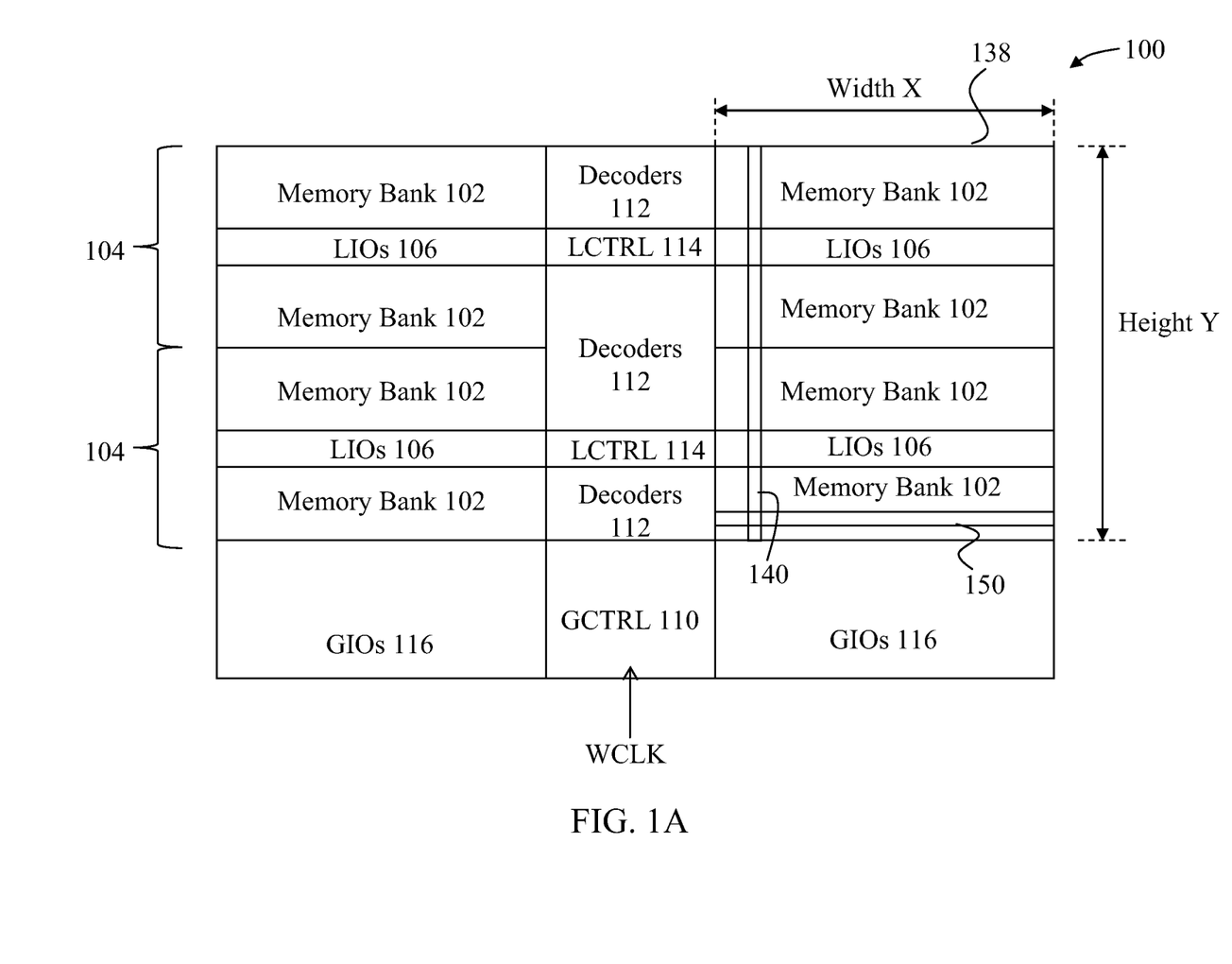
FIG. 1A is a diagram of a memory macro, in accordance with some embodiments.

FIG. 1A is a block diagram of a static random access memory (SRAM) macro 100, in accordance with some embodiments. In this document, "rise" refers to transitioning from a low logical value to a high logical value. "Fall" refers to transitioning from a high logical value to a low logical value.

Memory macro 100 is symmetrical. For example, with reference to decoders 112, local control circuits (LCTRLs) 114, and global control circuit (GCTRL) 110, circuit elements on the left side are similar to circuit elements on the right side of memory macro 100. For example, memory macro 100 includes two memory arrays, one on the left side and one on the right side. For illustration, one memory array on the right side is labeled as memory array 138 that has a width X and a height Y.

Memory macro 100 includes a plurality of memory segments 104. Two memory segments 104 are shown for illustration. A different number of memory segments 104 is within the scope of various embodiments. Each segment 104 includes four memory banks 102, two memory banks on the left and two memory banks on the right. On each left and right side of memory macro 100, two memory banks 102 share a row of a plurality of local input-output circuits (LIO) 106. Memory cells in a memory bank 102 are arranged in rows and columns. As a result, memory cells in a memory segment 104 and in a memory array 138 are also arranged in rows and columns. A memory cell is described with reference to FIG. 3 below, and is labeled 122. Different configurations of a memory segment are within the scope of various embodiments.

Address decoders 112 provide the X- or row-address of memory cells to be accessed for a read or a write operation. LCTRL 114 controls LIOs 106. Global input-output (GIO) circuits 116 serve to transfer data between the memory cells and other circuits outside of memory macro 100. GCTRL 110 provides the address pre-decode, clock, and other signals for memory macro 100. GCTRL 110 also controls the data transfer between memory cells and circuits outside of memory macro 100.

Figure 2A:
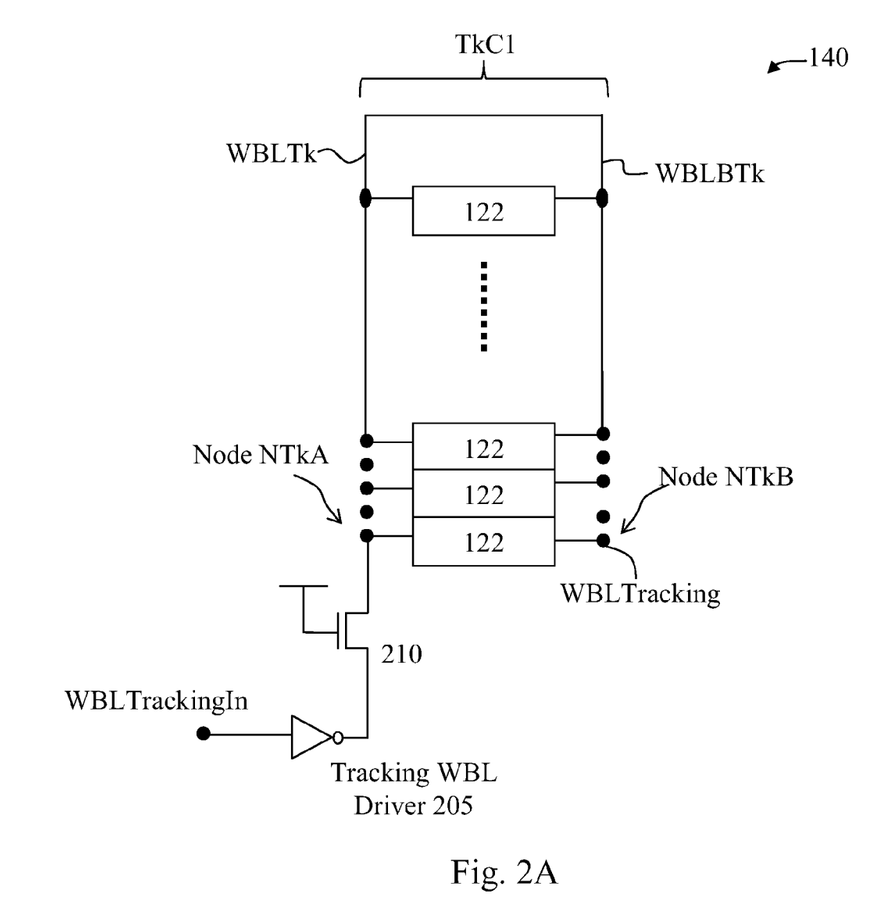
FIG. 2A is a diagram of a write bit line (WBL) tracking circuit, in accordance with some embodiments.
Figure 2B:
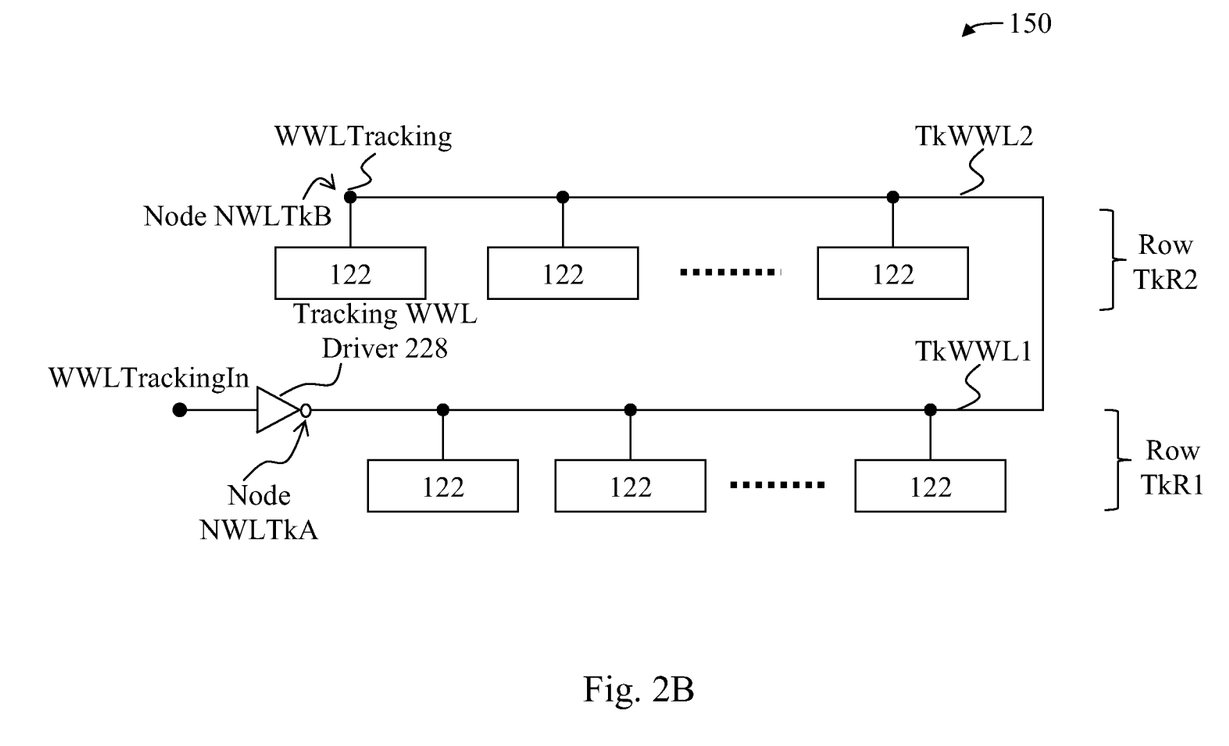
FIG. 2B is a diagram of a write word line (WWL) tracking circuit, in accordance with some embodiments.

Memory macro 100 includes a write bit line (WBL) tracking circuit 140 and a write word line (WWL) tracking circuit 150, which are explained in details with reference to FIGS. 2A and 2B, respectively. For illustration, WBL tracking circuit 140 and WWL tracking circuit 150 are shown in the right side of memory macro 100. Various embodiments of the disclosure are not limited to the location of WBL tracking circuit 140 and/or WWL tracking circuit 150.

Write clock signal WCLK is received from outside of memory macro 100, is used to activate various writing signals of a memory cell to be written, and to activate tracking signals in WBL tracking circuit 140 and WWL tracking circuit 150.

Writing to a Memory Cell

Figure 1B:
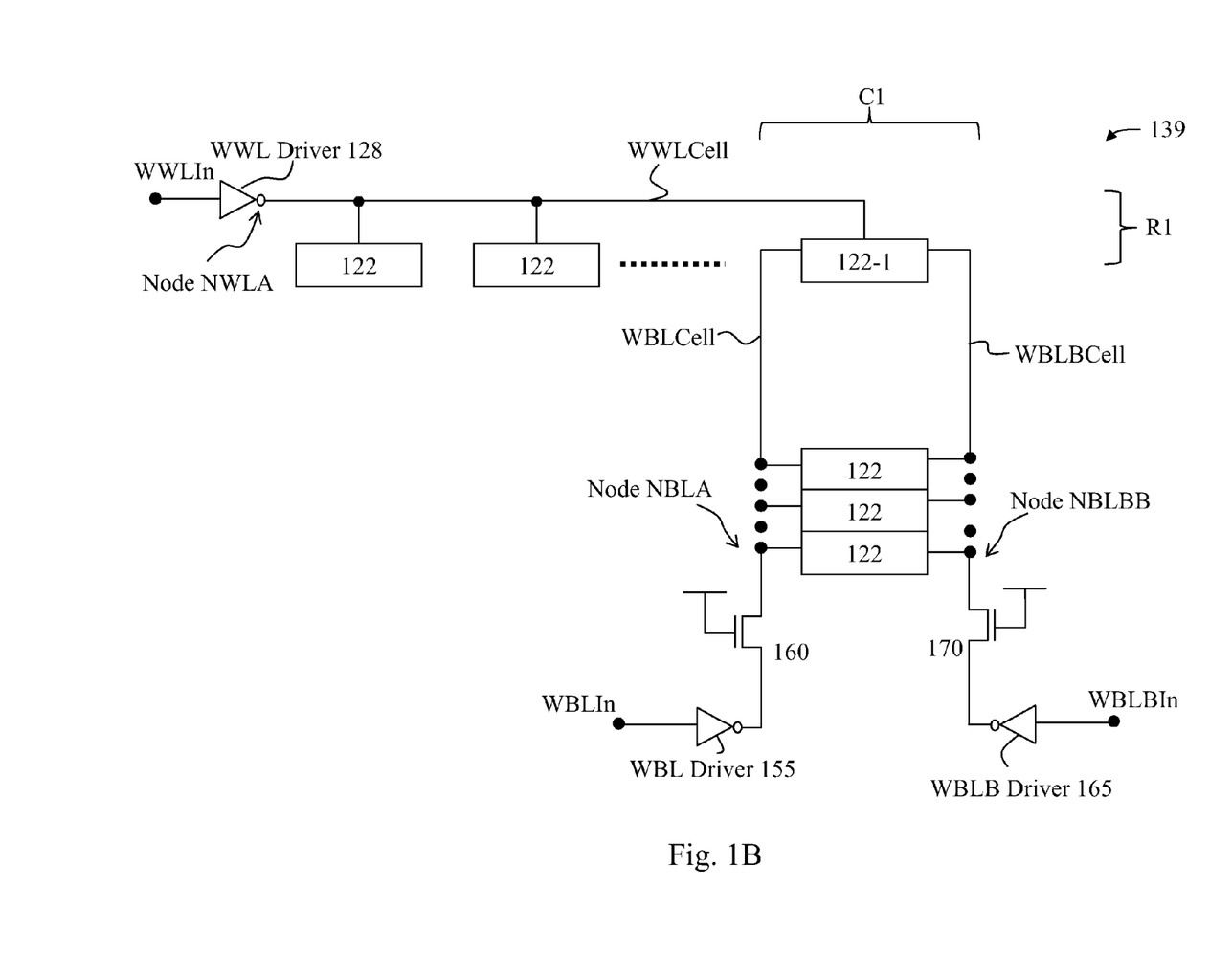
FIG. 1B is a diagram of a circuit illustrating writing to a memory cell, in accordance with some embodiments.

FIG. 1B is a diagram of a circuit 139, in accordance with some embodiments. Circuit 139 is used to illustrate data is to be written to a memory cell 122-1.

In some embodiments, memory cells 122 in a row of memory array 138 are coupled to a write word line while memory cells 122 in a column are coupled to a pair of write bit lines. For illustration, memory cell 122-1 is in both row R1 and column C1, as shown in FIG. 1B. Further, memory cell 122-1 is coupled to a write word line having signal WWLCell and a pair of write bit lines having corresponding signals WBLCell and WBLBCell. For simplicity, the word lines coupled to memory cells 122 other than memory cell 122-1 in column C1 are not shown. Similarly, the pairs of bit lines coupled to memory cells 122 other than memory cell 122-1 in row R1 are not shown. In some embodiments, column C1 includes memory cells 122 that expand the height Y of memory array 138 in FIG. 1A while row R1 includes memory cells 122 that expand the width X of memory array 138.

In a write operation of a memory cell, the corresponding write word line is activated and one corresponding write bit line are used. For example, in the write operation of memory cell 122-1, based on a rising edge of clock signal WCLK in FIG. 1A, write word line (WWL) driver 128 is activated to invert signal WWLIn to generate signal WWLCell. In other words, signal WWLCell is activated. Compared with signal WWLCell at node NWLA, the time delay of signal WWLCell at memory cell 122-1 is approximately the time delay of one write word line in a memory array 138. Those of ordinary skill in the art will recognize that the time delay of signal WWLCell at a memory cell 122 in row R1 is at most the time delay of one write word line. In other words, compared with the time delay of signal WWLCell at other memory cells 122 in row R1, the time delay of signal WWLCell at memory cell 122-1 is the longest time delay.

Also for illustration, signal WBLCell on a write bit line (versus signal WBLBCell on the other write bit line) is used in the write operation of memory cell 122-1. In some embodiments, before memory cell 122-1 is written, signals WBLCell and WBLBCell are pre-charged to a high logical value. Signal WBLIn is applied with a high logical value. After a rising edge of clock signal WCLK, WBL driver 155 is activated to invert signal WBLIn. As a result, the signal at the output of WBL driver 155 is logically low. The output of WBL driver 155 is coupled to the source of transistor 160. Consequently, signal WBLCell at the drain of transistor 160 is pulled to a low logical value at the source of transistor 160. Compared with signal WBLCell at node NBLA, the time delay of signal WBLCell at memory cell 122-1 is approximately the time delay of one write bit line of memory array 138, and is the longest time delay compared with the time delay of signal WBLCell at other memory cells 122 in column C1. Effectively, the time delay of signal WBLCell at a memory cell 122 in column C1 is at most the time delay of one write bit line of memory array 138.

The operation of transistor 170, WBLB driver 165, and signal WBLBIn with respect to signal WBLBCell is similar to the operation of transistor 160, WBL driver 155, and signal WBLin with respect to signal WBLCell, and should be recognizable by persons of ordinary skill in the art.

Memory cell 122-1 at one end of a write word line having signal WWLCell is used to illustrate the worst case time delay of signal WWLCell. Similarly, memory cell 122-1 at one end of the pair of write bit lines having corresponding signals WBLCell and WBLBCell is used to illustrate the worst case time delay of signal WBLCell. Writing to another memory cell 122 in a different location of row R1 and/or column C1 is similar, and should be recognizable by persons of ordinary skill in the art.

WBL Tracking Circuit

FIG. 2A is a diagram of a WBL tracking circuit 140 in FIG. 1, in accordance with some embodiments. WBL tracking circuit 140 is used to generate write signals that cover the worst case write condition for memory cells 122 in a column, such as column C1 in FIG. 1B. Column TkC1 includes the same number of memory cells 122 as column C1 does.

WBL tracking circuit 140 includes a plurality of memory cells 122 that are from a column of memory cells 122 that expand the height Y of memory array 138, such as column C1. The plurality of memory cells 122 in WBL tracking circuit 140 is from various segments 104 of memory macro 100. Each memory cell 122 is coupled to a pair of tracking write bit lines WBLTk and WBLBTk. Write bit lines WBLTk and WBLBTk are coupled together. A tracking write bit line WBLTk or WBLBTk is similar to a write bit line having signal WBLCell or signal WBLBCell.

Tracking signal WBLTracking at node NTkB is the result of signal WBLTrackingIn passing through write driver 205, transistor 210, write bit line WBLTk, and write bit line WBLBTk. Approximately, signal WBLTracking at node NTkB passes through two write bit lines WBLTk and WBLBTk. Explained differently, tracking signal WBLTracking is a signal at node NTkA delayed by the time delay of two write bit lines. Node NTkA is coupled to the drain of transistor 210.

Tracking WBL driver 205 controls signal WBLTracking based on signal WBLTrackingIn. In some embodiments, before writing, bit lines WBLTk and WBLBTk are pre-charged to a high logical value. After a rising edge of clock signal WCLK, tracking WBL driver 205 is activated to invert signal WBLTrackingIn. As a result, when signal WBLTrackingIn transitions from low to a high logical value, the output of tracking WBL driver 205 transitions from a high to a low logical value. The output of driver 205 is coupled to the source of NMOS transistor 210. Effectively, signal WBLTracking at node NTkA at the drain of NMOS transistor 210 is pulled from a high to a low logical value at the source of NMOS transistor 210. In some embodiments, signal WBLTrackingIn and signal WBLIn in FIG. 1B are activated at the same time based on the rising edge of clock signal WCLK that activates corresponding tracking WBL driver 205 and WBL driver 155 in FIG. 1B. As a result, signal WBLCell and signal WBLTracking are pulled down at the same time. Signal WBLTracking at node NTkB is delayed more than signal WBLCell at any memory cell 122 in column C1 in FIG. 1B. As a result, when signal WBLTracking at node NTkB is used to generate signal WriteReset in FIG. 2C, with respect to the write bit line, signal WBLTracking covers the write timing for the worst case condition in a column of memory array 138, such as column C1 in FIG. 1B.

In various embodiments, the resistance of the write bit line having signal WBLCell and that of a write bit line having signal WBLBCell in FIG. 1B are the same. Similarly, the resistance of a tracking write bit line WBLTk and that of a tracking write bit line WBLBTk are the same. Further, the capacitance of the write bit line having signal WBLCell and that of the write bit line having signal WBLBCell are the same. The capacitance of tracking write bit line WBLTk and that of tracking write bit line WBLBTk are also the same.

For illustration, R is the resistance and C is the capacitance of the write bit line having signal WBLCell or WBLBCell. As a result, the resistance experienced by signal WBLTracking at node NTkB is 2R because signal WBLTracking passes through both write bit line WBLTk and write bit line WBLBTk. Similarly, the capacitance seen by signal WBLTracking at node NTkB is 2C. If $\tau$ is the time constant of the write bit line having signal WBLCell, $\tau=RC$. if $\tau'$ is the time constant experienced by tracking write bit line WBLTracking at node NTkB, then $\tau'=2R*2C=4RC=4\tau$.

In some embodiments, it takes one τ for the voltage of signal WBLCell to drop from a high logical value of operational voltage VDD to about half of operational voltage VDD to turn to a low logical value. Further, it takes about 3τ to drop to about 5% of operational voltage VDD. On the other hand, it takes 4τ for signal WBLTracking at node NTkB to drop from a high logical value of operational voltage VDD to about half of operational voltage VDD to turn to a low logical value. As a result, when signal WBLTracking at node NTkB has reached from the high logical value to turn to a low logical value, signal WBLCell has reached its low logical value of about less than 5% of operational voltage VDD, in some embodiments. Stated in a different way, when signal WBLTracking at node NTkB is used to generate signal WriteReset, with respect to the write bit line, signal WriteReset covers the write timing for a memory cell in the worst case situation.

WWL Tracking Circuit

FIG. 2B is a diagram of a write word line (WWL) tracking circuit 150, in accordance with some embodiments. WWL tracking circuit 150 is used to generate signals that cover the worst case write situation for memory cells in a row, such as row R1 in FIG. 1B. For example, after a rising edge of clock signal WCLK in FIG. 1A, tracking WWL driver 228 is activated to invert signal WWLTrackingIn. As a result, signal WWLTracking is generated on write word line TkWWL2 coupled to write word line TkWWL1.

WWL tracking circuit 150 includes two rows of memory cells 122 of memory array 138, as illustratively shown as row TkR1 and row TkR2. Each row TkR1 and TkR2 includes memory cells 122 that expand the width X of memory array 138, and has the same number of memory cells 122 as row R1 in FIG. 1B. Tracking write word line TkWWL1 is coupled to memory cells 122 in row TkR1 while tracking write word line TkWWL2 is coupled to memory cells 122 in row TkR2. Tracking write word lines TkWWL1 and TkWWL2 are coupled together.

In some embodiments, the time delays of write word lines in memory macro 100 are the same. Effectively, the time delay of the write word line having signal WWLCell in FIG. 1B and of write word lines WWL1 and WWL2 are the same.

Signal WWLTracking at node NWLTkB is signal WWLTrackingIn passing through tracking WWL driver 228, tracking write word lines WWL1 and WWL2. Approximately, signal WWLTracking at node NWLTkB experiences the time delay of two write word lines. Explained in a different way, signal WWLTracking at node NWLTkB is signal WWLTracking at node NWLTkA delayed by two write word lines. The time delay experienced by signal WWLTracking at node NWLTkB is greater than the time delay experienced by signal WWLCell at any memory 122 on row R1 in FIG. 1B. As a result, when signal WWLTracking at node NWLTkB is used to generate signal WriteReset, signal WWLTracking covers the worst case write situation of a memory cell in a row of memory array 138, such as row R1 in FIG. 1B.

In some embodiments, memory cells 122 in row TkR1 and/or TkR2 are part of column TkC1 in FIG. 2A. In some other embodiments, memory cells in row TkR1 and/or TkR2 are not part of column TkC1.

Memory cells 122 in two rows TkR1 and TkR2 are used in WWL tracking circuit 150 for illustration. A different number of memory cells 122 coupled to a write word line having a different length is within the scope of various embodiments. For example, in some embodiments, the number of memory cells 122 used in WWL tracking circuit 150 is at least the number of memory cells 122 in a row. In such a situation, the length of the tracking write word line is at least the length of the write word line in a row of memory array 138. For another example, one row, such as either row TkR1 or TkR2, instead of two rows TkR1 and TkR2 is used in WWL tracking circuit 150. For another example, half of the memory cells 122 in each row TkR1 and row TkR2 and half of the write word line in each row are used. In such a situation, the number of memory cells 122 in WWL tracking circuit 150 is the same as the number of memory cells 122 in one row of memory array 138. Further, the length of the tracking write word line is the same as the length of a write word line of memory array 138.

Reset Signal Generation Circuit

Figure 2C:
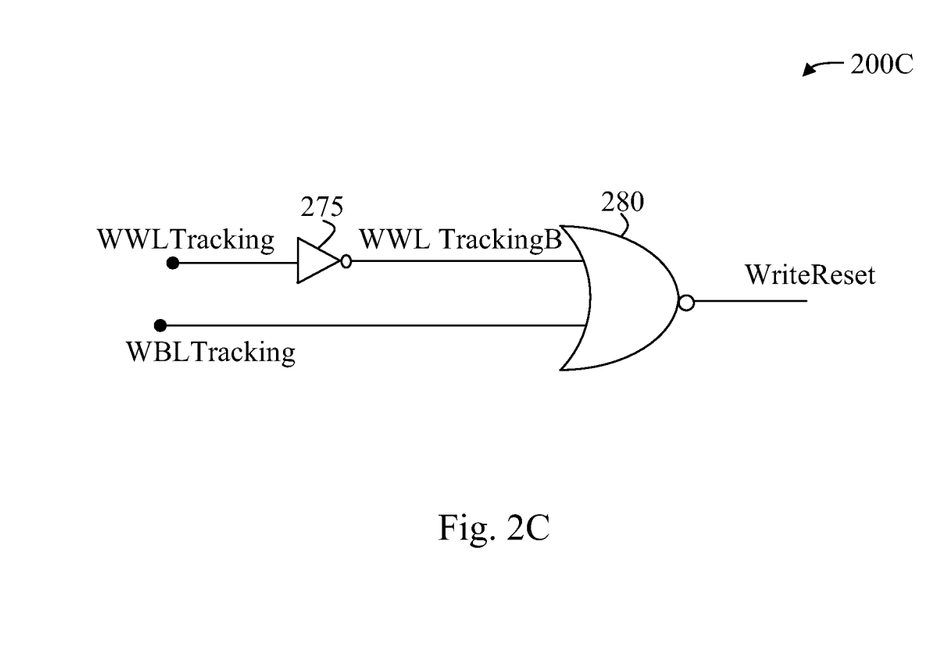
FIG. 2C is a diagram of a selection circuit, in accordance with some embodiments.

FIG. 2C is a diagram of a circuit 200C used to generate a reset signal WriteReset based on signal WBLTracking at node NTkB in FIG. 2A and signal WWLTracking at node NWLTkB in FIG. 2B, in accordance with some embodiments. Signal WriteReset is commonly called write-timing control signal. For simplicity, unless otherwise stated, signal WBLTracking at node NTkB and signal WWLTracking at node NWLTkB are call signal WBLTracking and signal WWLTracking, respectively.

Inverter 275 inverts signal WWLTracking to generate signal WWLTrackingB.

NOR gate 280 receives signals WWLTrackingB and WBLTracking as inputs and provides reset signal WriteReset as an output. In some embodiments, circuit 200C is applicable when signal WWLTracking transitions from a low to a high logical value, and signal WBLTracking transitions from a high to a low logical value, or, effectively, when both signals WWLTrackingB and WBLTracking transition from a high logical value to a low logical value. As a result, when both signals WWLTrackingB and WBLTracking are logically low, signal WriteReset is logically high. Effectively, signal WriteReset is activated or turned logically high by the slower of two signals WWLTracking and WBLTracking. For example, when signal WWLTracking transitions from a low to a high logical value, both signals WWLTrackingB and WBLTracking transition from a high logical value to a low logical value. If signal WWLTracking and thus signal WWLTrackingB are slower than signal WBLTracking, signal WriteReset is not turned logically high until signal WWLTracking reaches the trip point to be logically high and signal WWLTrackingB reaches the trip point to be logically low. If signal WBLTracking is slower than signal WWLTracking and thus signal WWLTrackingB, signal WriteReset is not turned logically high until signal WBLTracking reaches the trip point to be logically low.

Tracking write word line WWLTracking covers the worst case write situation of memory cells 122 in the X direction of memory array 138. Tracking write bit line WBLTracking covers the worst case write situation of memory cells in the Y direction of memory array 138. In other words, signal WriteReset covers the worst case time delay of width X and height Y of memory array 138. As a result, the tracking mechanism in various embodiments is useful for different configurations of memory array 138, regardless of the relative dimension between width X and height Y. For example, when height Y of memory array 138 is greater than width X of memory array 138, signal WBLTracking is slower than signal WWLTracking. As a result, signal WriteReset is determined by signal WBLTracking. In contrast, when width X of memory array 138 is greater than height Y of memory array 138, signal WWLTracking is slower than signal WBLTracking. As a result, signal WriteReset is determined by signal WWLTracking.

FIG. 2C is used for illustration. Other mechanisms selecting the slower signal of signal WWLTracking and WBLTracking to generate signal WriteReset are within the scope of various embodiments.

Memory Cell

Figure 3:
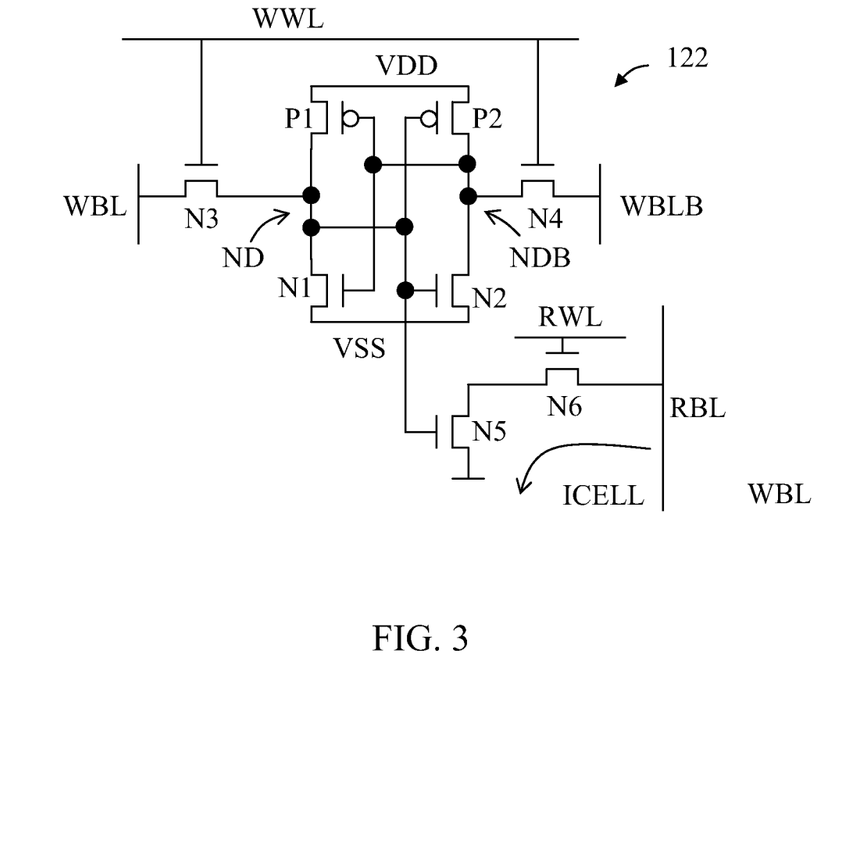
FIG. 3 is a diagram of a memory cell, in accordance with some embodiments.

FIG. 3 is a circuit diagram of a memory cell 122, in accordance with some embodiments. Memory cell 122 includes two P-type metal oxide semiconductor (PMOS) transistors P1 and P2, and six N-type metal oxide semiconductor (NMOS) transistors N1, N2, N3, N4, N5, and N6. Transistors N5 and N6, read word line RWL and RBL form a read port to process data in node ND and NBD as would be recognizable by persons of ordinary skill in the art.

In some embodiments, a plurality of memory cells 122 is arranged in rows and columns of memory array 138, such as row R1 and column C1 in FIG. 1B. A plurality of memory cell 122 is also used in write tracking circuits, such as WBL tracking circuit 140 and WWL tracking circuit 150 in FIGS. 2A and 2B, respectively.

Write word line WWL is coupled to each gate of transistors N3 and N4 of a plurality of memory cells 122 to a form a row of memory cells. For example, in FIG. 1B, a first write word line WWL is coupled to the gates of transistors N3 and N4 of the plurality of memory cells 122 in row R1. The first write word line WWL thus carries signal WWLCell. In FIG. 2B, a second write word line WWL is designated as tracking write word line TkWWL1, and is coupled to the gates of transistors N3 and N4 of the plurality of memory cells in row TkR1. Similarly, a third write word line WWL is designated as write word line TkWWL2, and is coupled to the gates of transistors N3 and N4 of a plurality of memory cells of row R2. Write word line WWL is commonly called a write control line.

The drains of each of transistors N3 and N4 are coupled to a pair of write bit lines WBL and WBLB, respectively. Write bit lines WBL and WBLB are coupled to each drain of transistors N3 and N4 of the plurality of memory cells 122 to form a column. For example, in FIG. 1B, a first write bit line WBL is used as the write bit line carrying signal WBLCell, and is coupled to each drain of transistor N3 of the plurality of memory cells 122 in column C1. Similarly, a first write bit line WBLB is designated as the write bit line carrying signal WBLBCell, and is coupled to each drain of transistor N4 of the plurality of memory cells 122 in column C1. In FIG. 2A, a second write bit line WBL is designated as write bit line WBLTk, and is coupled to each drain of transistors N3 of the plurality of memory cells 122 in column TkC1. Similarly, a second write bit line WBLB is designated as write bit line WBLBTk, and is coupled to each drain of transistors N4 of the plurality of memory cells 122 in column TkC1. Write bit lines WBL and WBLB are commonly called write data lines.

In a write operation for memory cell 122, write word line WWL is activated. The logical values to be written to memory cell 122 are placed at write bit lines WBL and WBLB, which are then transferred to and stored at nodes ND and NDB at the sources of transistors N3 and N4, respectively.

For illustration, node ND of memory cell 122-1 in FIG. 1B stores a high logical value, and a low logical value is to be written to node ND of memory cell 122-1. Before writing, signal WBLCell is pre-charged to a high logical value. WWL driver 128 inverts a low logical value of signal WWLIn to active the write word line having signal WWLCell. Transistor N3 of memory cell 122-1 is turned on. At the same time, WBL driver 155 inverts a logical high value of signal WBLIn to generate a low logical value at the output of WBL driver 155. Signal WBLCell is pulled to a low logical value at the source of transistor 160. As a result, the low logical value of signal WBLCell is transferred to node ND. In other words, node ND is written with a low logical value. The operation to write node NDB with respect to transistor N4, and write bit line WBLB is similar, and should be recognizable by persons of ordinary skill in the art.

In WBL tracking circuit 140, tracking signal WBLTracking is pulled from a high logical value to a low logical value similar to signal WBLCell being pulled from a high logical value to a low logical value. For example, before writing, write bit line WBLTk coupled to WBLBTk is pre-charged to a high logical value. After a rising edge of clock signal WCLK, tracking WBL driver 205 is activated to invert a high logical value of signal WBLTrackingIn to a low logical value. Signal WBLTracking on write bit line WBLTk (and WBLBTk) is pulled to the low logical value at the source of transistor 210. In some embodiments, write word lines WWL of memory cells 122 in tracking circuit 140 are coupled to ground or voltage VSS. As a result, the data in memory cells 122 in tracking circuit 140 do not change.

Exemplary Waveforms

Figure 4A:
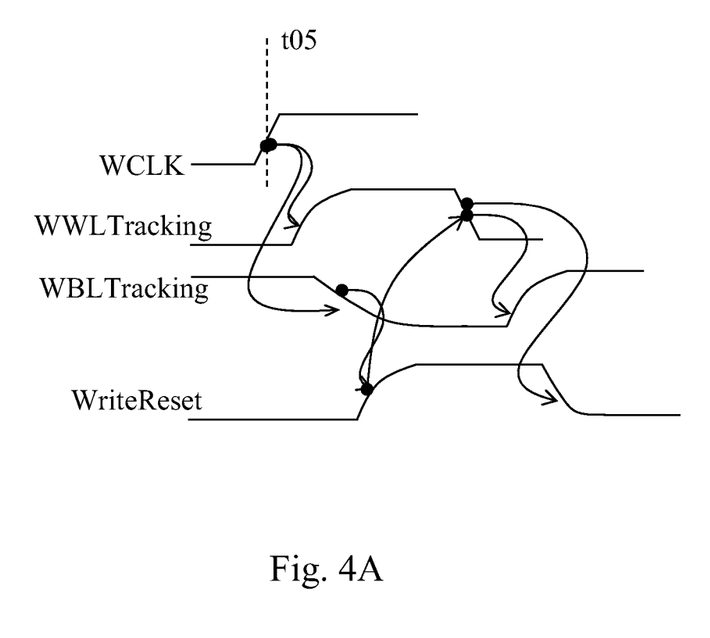
FIG. 4A is graphs of waveforms illustrating the reset signal being affected by the write bit line tracking signal, in accordance with some embodiments.

FIG. 4A is a graph of waveforms illustrating the relationship between various signals in which signal WriteReset in FIG. 2C is determined by signal WBLTracking, in accordance with some embodiments. In this illustration, signal WBLTracking is slower than signal WWLTracking.

At time t05, the rising edge of write clock signal WCLK causes tracking WWL driver 228 and tracking WBL driver 205 to be activated, which, in turn, cause signal WWLTracking to rise and signal WBLTracking to fall. Because signal WBLTracking is slower than signal WWLTracking, by operation of circuit 200C, the falling edge of signal WBLTracking causes signal WriteReset to rise.

The rising edge of signal WriteReset causes signal WWLTracking to fall, which causes signal WBLTracking to rise, and signal WriteReset to fall.

Figure 4B:
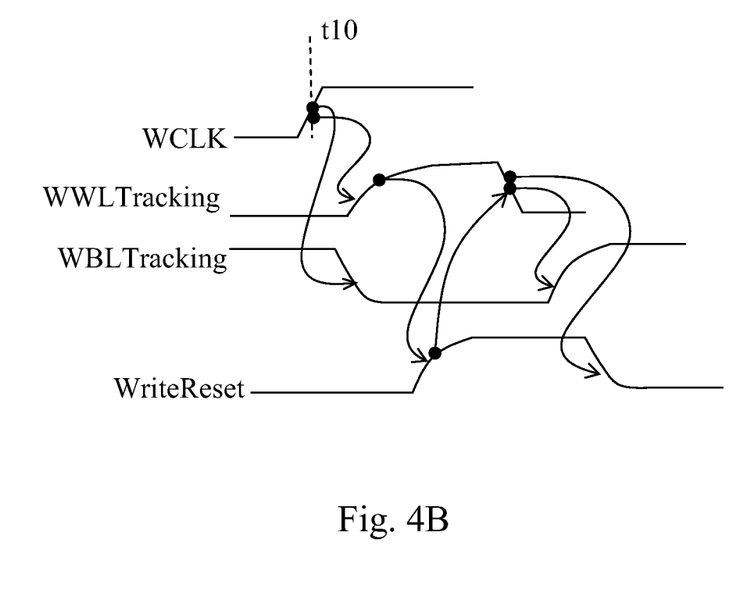
FIG. 4B is graphs of waveforms illustrating the reset signal being affected by the write word line tracking signal, in accordance with some embodiments.

FIG. 4B is a graph of waveforms illustrating signal WriteReset is determined by signal WWLTracking, in accordance with some embodiments. In this illustration, signal WWLTracking is slower than signal WBLTracking.

At time t10, the rising edge of write clock signal WCLK causes tracking WWL driver 228 and tracking WBL driver 205 to be activated, which, in turn, cause signal WWLTracking to rise and signal WBLTracking to fall. Because signal WWLTracking is slower than signal WBLTracking, the falling edge of signal WWLTracking causes signal WriteReset to rise.

Similar to the situation in FIG. 4A, the rising edge of signal WriteReset causes signal WWLTracking to fall, which causes signal WBLTracking to rise and signal WriteReset to fall.

Figure 4C:
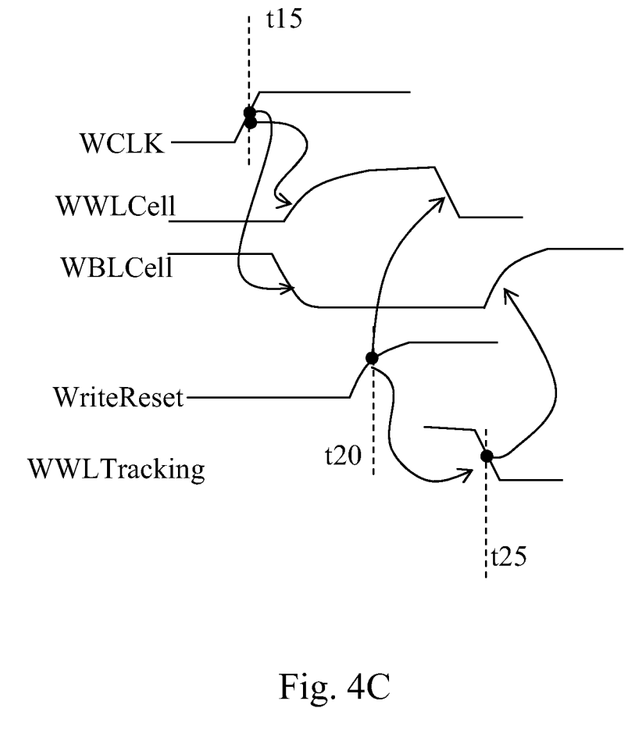
FIG. 4C is graphs of waveforms illustrating the relationships of various write signals of a memory cell to be written.

FIG. 4C is a graph of waveform, illustrating the relationship of various signals used in writing to memory cell 122-1 in FIG. 1B, in accordance with some embodiments. The below illustration is explained with reference to FIG. 4A, but is equally applicable to FIG. 4B and should be recognizable by persons of ordinary skill in the art. For example, in FIG. 4C, signal WriteReset is signal WriteReset in either FIG. 4A or FIG. 4B. For another example, when signal WBLTracking is slower than signal WWLTracking, signal WriteReset in FIG. 4A is signal WriteReset in FIG. 4C. In contrast, when signal WWLTracking is slower than signal WBLTracking, signal WriteReset in FIG. 4B is signal WriteReset in FIG. 4C. Similarly, signal WWLTracking in FIG. 4C is signal WWLTracking in either FIG. 4A or FIG. 4B. For example, when signal WBLTracking is slower than signal WWLTracking, signal WWLTracking in FIG. 4A is signal WWLTracking in FIG. 4C. In contrast, when signal WWLTracking is slower than signal WBLTracking, signal WWLTracking in FIG. 4B is signal WWLTracking in FIG. 4C. Time t15 occurs at the same time with time t05 in FIG. 4A or time t10 in FIG. 4B.

At time t15, the rising edge of clock signal WCLK causes WWL driver 128 and WBL driver 155 in FIG. 1B to be activated, which cause signal WWLCell to rise and signal WBLCell to fall.

At time t20, the rising edge of signal WriteReset causes signals WWLCell and signal WWLTracking to fall.

At time t25, the falling edge of signal WWLTracking causes signal WBLCell to rise.

In the above illustration, the width of each signal WWLCell and WBLCell is sufficiently long so that the low logical value of the signal WBLCell is transferred to node ND of memory cell 122-1 in FIG. 1B. Effectively, based on tracking circuits 140 and 150 above, signals WriteReset is designed such that the falling edge of signal WWLCell and the rising edge of signal WBLCell are delayed so that the write timing to write data to any memory cell 122 in memory array 138 is achieved. Without such delay from tracking circuits 140 and 150, writing can fail due to short write timings.

Exemplary Method

Figure 5:
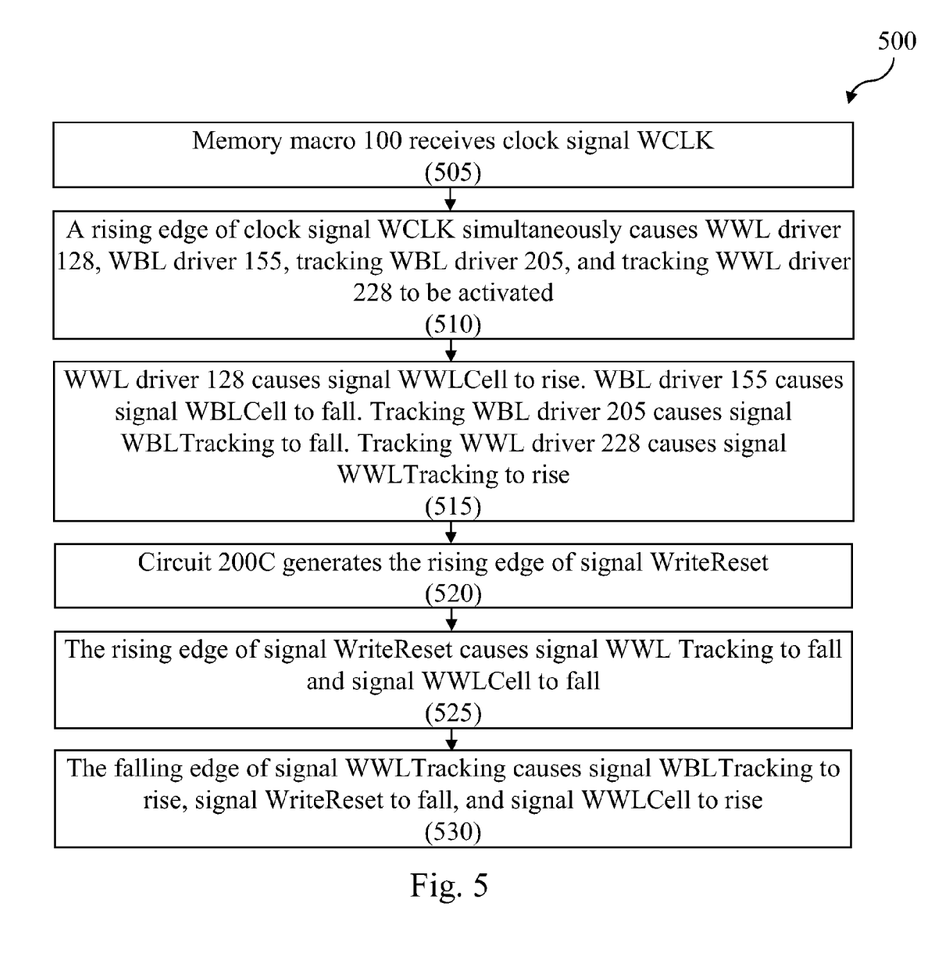
FIG. 5 is a flowchart of a method illustrating operations of the circuits in FIGS. 2A, 2B, 2C, and 3, in accordance with some embodiments.

FIG. 5 is a flowchart of a method 500 illustrating the operation of memory macro 100, circuit 139, circuit 140, and circuit 150, in accordance with some embodiments. As a result, node ND of memory cell 122-1 in FIG. 1B is written with a low logical value.

In operation 505, memory array 100, receives clock signal WCLK.

In operation 510, a rising edge of clock signal WCLK causes WWL driver 128, WBL driver 155, tracking WBL driver 205, and tracking WWL driver 228 to be activated.

In operation 515, WWL driver 128 in FIG. 1B causes signal WWLCell to rise. WBL driver 155 in FIG. 1B causes signal WBLCell to fall. Tracking WBL driver 205 in FIG. 2A causes signal WBLTracking to fall, and tracking WWL driver 228 in FIG. 2B causes signal WWLTracking to rise.

In operation 520, circuit 200C generates the rising edge of signal WriteReset based on the rising edge of signal WWLTracking and the falling edge of signal WBLTracking.

In operation 525, the rising edge of signal WriteReset causes signal WWLTracking to fall and signal WWLCell to fall.

In operation 530, the falling edge of signal WWLTracking causes signal WBLTracking to rise, signal WriteReset to fall, and signal WBLCell to rise.

In the above illustration, during the time signal WWLCell is logically high and signal WBLCell is logically low, the low logical value of signal WBLCell is transferred to node ND of memory cells 122-1 in FIG. 1B. Effectively, node ND of memory cell 122-1 is written with a low logical value.

A number of embodiments have been described. It will nevertheless be understood that various modifications may be made without departing from the spirit and scope of the disclosure. For example, various transistors being shown as a particular dopant type, such as N-type or P-type Metal Oxide Semiconductor (NMOS or PMOS) are for illustration. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different values is within the scope of various embodiments.

In some embodiments regarding a method, a first edge of a first tracking signal in a first direction of a memory array is generated. A first edge of a second tracking signal in a second direction of the memory array is generated. A first edge of a write-timing control signal is generated based on a slower edge of the first edge the first tracking signal and of the first edge of the second tracking signal. The first edge of the write-timing control signal is used to generate a second edge of the second tracking signal.

In some embodiments regarding a method, a first edge of a first tracking signal in a first direction of a memory array is generated. A first edge of a second tracking signal in a second direction of the memory array is generated. A first edge of a write-timing control signal is generated based on a slower edge of the first edge of the first tracking signal and the first edge of the second tracking signal. A first edge of a write clock signal is used to simultaneously generate the first edge of the first tracking signal, the first edge of the second tracking signal, a first edge of a cell control signal of a memory cell to be written, and a first edge of a cell data signal of the memory cell to be written.

In some embodiments, a circuit in a memory macro comprises a first tracking circuit, a second tracking circuit, and a selection circuit. The first tracking circuit is configured to generate a first edge of a first tracking signal in a first direction of the memory macro. The second tracking circuit is configured to generate a first edge of a second tracking signal in a second direction of the memory macro. The selection circuit is configured to select a slower edge between the first edge of the first tracking signal and the first edge of the second tracking signal, and to generate a first edge of a write-timing control signal. The first tracking circuit includes a first set of memory cells. The second tracking circuit includes a second set of memory cells.

The above illustration includes exemplary steps, but the steps are not necessarily performed in the order explained. Steps may be added, replaced, changed order, and/or eliminated as appropriate, in accordance with the spirit and scope of disclosed embodiments.

What is claimed is:

1. A method comprising:
   generating a first edge of a first tracking signal in a first direction of a memory array;
   generating a first edge of a second tracking signal in a second direction of the memory array; and
   generating a first edge of a write-timing control signal based on a slower edge of the first edge of the first tracking signal and the first edge of the second tracking signal,
   wherein
      the first edge of the write-timing control signal is used to generate a second edge of the second tracking signal.

2. The method of claim 1, wherein
   the first tracking signal travels through a first tracking data line and a second tracking data line;
   the first tracking data line and the second tracking data line are coupled together; and
   the first tracking data line and the second tracking data line are each coupled to a first set of memory cells of the memory array.

3. The method of claim 1, wherein
   the second tracking signal travels through a first tracking control line and a second tracking control line;
   the first tracking control line and the second tracking control line are coupled together;

the first tracking control line is coupled to a first set of memory cells of the memory array; and the second tracking control line is coupled to a second set of memory cells of the memory array.

4. The method of claim 1, wherein
the second edge of the second tracking signal is used to generate a second edge of the first tracking signal.

5. The method of claim 1, wherein
a first edge of a write clock signal is used to simultaneously generate the first edge of the second tracking signal and a first edge of a cell control signal of a memory cell to be written.

6. The method of claim 1, wherein
a first edge of a write clock signal is used to simultaneously generate the first edge of the second tracking signal, a first edge of a cell control signal of a memory cell to be written, and a first edge of a cell data signal of the memory cell to be written; and
the first edge of the write-timing control signal is used to generate a second edge of the cell data signal of the memory cell to be written.

7. The method of claim 1, wherein
the first tracking signal is carried on a first tracking data line and a second tracking data line;
the first tracking data line and the second tracking data line are each coupled to a first number of memory cells;
a cell data line of a memory cell to be written is coupled to a second number of memory cells; and
the first number of memory cells is equal to the second number of memory cells.

8. The method of claim 1, wherein
the second tracking signal is carried on a first tracking control line;
the first tracking control line is coupled to a first number of memory cells;
a cell control line of a memory cell to be written is coupled to a second number of memory cells; and
the first number of memory cells is equal to or greater than the second number of memory cells.

9. A method comprising:
generating a first edge of a first tracking signal in a first direction of a memory array;
generating a first edge of a second tracking signal in a second direction of the memory array; and
generating a first edge of a write-timing control signal based on a slower edge of the first edge of the first tracking signal and the first edge of the second tracking signal,
wherein
a first edge of a write clock signal is used to generate the first edge of the first tracking signal, the first edge of the second tracking signal, a first edge of a cell control signal of a memory cell to be written, and a first edge of a cell data signal of the memory cell to be written.

10. The method of claim 9, wherein
the first edge of the write-timing control signal is used to generate a second edge of the cell control signal of the memory cell to be written, and to generate a second edge of the second tracking signal.

11. The method of claim 10, wherein
the second edge of the second tracking signal is used to generate at least one of the following:
a second edge of the cell data signal of the memory cell to be written;
a second edge of the first tracking signal; or
a second edge of the write-timing control signal.

12. A circuit in a memory macro, comprising:
a first tracking circuit configured to generate a first edge of a first tracking signal in a first direction of the memory macro;
a second tracking circuit configured to generate a first edge of a second tracking signal in a second direction of the memory macro; and
a selection circuit configured to select a slower edge of the first edge of the first tracking signal and the first edge of the second tracking signal, and to generate a first edge of a write-timing control signal,
wherein
the first tracking circuit includes a first set of memory cells; and
the second tracking circuit includes a second set of memory cells.

13. The circuit of claim 12, wherein
the first direction is in the bit line direction of the memory macro; and
the second direction is in the word line direction of the memory macro.

14. The circuit of claim 12, wherein
the first set of memory cells is in the first direction of the memory macro; and
the second set of memory is in the second direction of the memory macro.

15. The circuit of claim 12, wherein
the first tracking circuit comprises a first tracking data line and a second tracking data line coupled together and configured to carry the first tracking signal;
each memory cell of the first set of memory cells is coupled to the first tracking data line on a first node of the each memory cell and to the second tracking data line on a second node of the each memory cell; and
the second tracking circuit comprises a first tracking control line coupled to the second set of memory cells and configured to carry the second tracking signal.

16. The circuit of claim 15, wherein
the first tracking control line comprises a second tracking control line coupled to a third tracking control line;
the second tracking control line is coupled to a third set of memory cells;
the third tracking control line is coupled to a fourth set of memory cells;
a number of memory cells in the third set of memory cells is half of a number of memory cells in the second set of memory cells; and
a number of memory cells in the fourth set of memory cells is half of the number of memory cells in the second set of memory cells.

17. The circuit of claim 12, wherein
the first tracking circuit further comprises
a first transistor coupled to a first end of the first tracking data line; and
a first driver coupled to the transistor and configured to receive a first tracking input signal and to generate the first tracking signal; and
the second tracking circuit further comprises
a second driver configured to receive a second tracking input signal and to generate the second tracking signal.

18. The circuit of claim 12, wherein
the circuit further comprises a third set of memory cells and a fourth set of memory cells;
a number of memory cells in the first set of memory cells equals to a number of memory cells in the third set of memory cells; and a number of memory cells in the second set of memory cells equals to or greater than a number of memory cells in the fourth set of memory cells.

19. The circuit of claim 18, wherein
the number of memory cells in the second set of memory cells is twice the number of memory cells in the fourth set of memory cells.

20. The circuit of claim 12, wherein the circuit is configured
- to generate the first edge of the second tracking signal based on a write clock signal;
- to generate a second edge of the second tracking signal based on the write-timing control signal;
- to generate the first edge of the first tracking signal based on the write clock signal; and
- to generate a second edge of the first tracking signal based on the second edge of the second tracking signal.

21. The circuit of claim 12, wherein the circuit is configured
- to generate a first edge of a cell control signal of a memory cell to be written based on a write clock signal;
- to generate a first edge of a cell data line of the memory cell to be written based on the write clock signal;
- to generate a second edge of the cell control signal of the memory cell to be written based on the first edge of the write-timing control signal;
- to generate a second edge of the second tracking signal based on the first edge of the write-timing control signal; and
- to generate a second edge of the cell data line of the memory cell to be written based on the second edge of the second tracking signal.

* * * * *